US006878503B2

(12) United States Patent
Hoshi et al.

(10) Patent No.: US 6,878,503 B2
(45) Date of Patent: Apr. 12, 2005

(54) HEAT-SENSITIVE LITHOGRAPHIC PRINTING PLATE PRECURSOR

(75) Inventors: Satoshi Hoshi, Shizuoka (JP); Norio Aoshima, Shizuoka (JP)

(73) Assignee: Fuji Photo Film Co., Ltd., Ashigara (JP)

( * ) Notice: Subject to any disclaimer, the term of this patent is extended or adjusted under 35 U.S.C. 154(b) by 1 day.

(21) Appl. No.: 10/265,735

(22) Filed: Oct. 8, 2002

(65) Prior Publication Data

US 2003/0099902 A1 May 29, 2003

(30) Foreign Application Priority Data

Oct. 10, 2001 (JP) .................................... P. 2001-312389

(51) Int. Cl.$^7$ .................................................. G03F 7/11

(52) U.S. Cl. ............................... 430/270.1; 430/272.1; 430/273.1; 430/275.1; 430/281.1; 430/286.1; 430/287.1

(58) Field of Search ............................. 430/272.1, 138, 430/270.1, 271.1, 273.1, 275.1, 278.1, 281.1, 286.1, 287.1

(56) References Cited

U.S. PATENT DOCUMENTS

| | | | | | |
|---|---|---|---|---|---|
| 6,090,524 | A | * | 7/2000 | Deboer et al. ........... | 430/272.1 |
| 6,397,749 | B1 | | 6/2002 | Kita et al. | |
| 6,468,717 | B1 | | 10/2002 | Kita et al. | |
| 6,555,285 | B1 | * | 4/2003 | Damme et al. .......... | 430/270.1 |
| 6,593,057 | B1 | * | 7/2003 | Kita ........................ | 430/270.1 |
| 6,620,573 | B1 | * | 9/2003 | Van Damme et al. ... | 430/270.1 |

FOREIGN PATENT DOCUMENTS

| | | | |
|---|---|---|---|
| EP | 1 072 402 | A2 | 1/2001 |
| EP | 1 084 826 | A1 | 3/2001 |
| EP | 1 134 077 | A2 | 9/2001 |
| EP | 1 147 886 | A2 | 10/2001 |
| EP | 1 226 936 | A2 | 7/2002 |
| JP | 2000-158839 | A | 6/2000 |
| JP | 2001-80226 | A | 3/2001 |
| JP | 2001-83692 | A | 3/2001 |
| JP | 2001-96936 | | 4/2001 |
| JP | 2001-232966 | A | 8/2001 |
| JP | 2001-260553 | A | 9/2001 |
| WO | WO 94/18005 | | 8/1994 |
| WO | WO 98/40212 | | 9/1998 |
| WO | WO 99/19143 | | 4/1999 |
| WO | WO 99/19144 | | 4/1999 |

* cited by examiner

*Primary Examiner*—Barbara L. Gilliam
(74) *Attorney, Agent, or Firm*—Burns, Doane, Swecker & Mathis, L.L.P.

(57) ABSTRACT

A heat-sensitive lithographic printing plate precursor comprising a support having provided thereon (A) an ink-receiving layer and (B) a hydrophilic layer comprising 80 to 99 parts by weight of a colloidal particulate oxide or hydroxide of at least one element selected from a group consisting of beryllium, magnesium, aluminum, silicon, titanium, boron, germanium, tin, zirconium, iron, vanadium, antimony and a transition metal, and 1 to 20 parts by weight of a polyacrylic acid having a weight-average molecular weight of more than 50,000, and at least one of the ink-receiving layer and the hydrophilic layer including a light-heat converting agent.

14 Claims, No Drawings

HEAT-SENSITIVE LITHOGRAPHIC PRINTING PLATE PRECURSOR

FIELD OF THE INVENTION

The present invention relates to a heat-sensitive lithographic printing plate precursor that does not require a development process. More specifically, the present invention relates to a lithographic printing plate precursor that is capable of being imagewise recorded by scanning exposure with an infrared laser beam based on digital signals, can be mounted on a printing machine without being subjected to a conventional developing process after the imagewise recording to conduct printing, and is excellent in sensitivity, ink receptivity at the beginning of printing and press life.

BACKGROUND OF THE INVENTION

Regarding heat-sensitive lithographic printing plate precursors, which can be mounted on a printing machine without being subjected to any processing to conduct printing, various methods have been proposed. One promising method is a method utilizing ablation, which comprises exposing a lithographic printing plate precursor to a high output solid infrared laser, for example, semiconductor laser or YAG laser and generating heat in the exposed area by a light-heat converting agent that converts light to heat to cause destructive evaporation.

Namely, the method comprises providing a hydrophilic layer on a substrate having a lipophilic ink-receptive surface or a lipophilic ink-receiving layer and eliminating the hydrophilic layer by ablation.

In WO94/18005 is disclosed a printing plate comprising a crosslinked hydrophilic layer on a lipophilic laser beam-absorbing layer, wherein the hydrophilic layer is subjected to ablation. The hydrophilic layer comprises polyvinyl alcohol crosslinked with a hydrolyzate of tetraethoxysilicon and particulate titanium dioxide so as to improve film strength of the hydrophilic layer. According to the technique, press life can be improved. However, since the hydrophilic layer is mainly composed of the polyvinyl alcohol having hydrocarbon groups, which is not necessarily highly hydrophilic, it is insufficient in stain resistance. Thus, further improvements have been required in the hydrophilic layer.

In WO98/40212, WO99/19143 and WO99/19144 are disclosed lithographic printing plate precursors capable of being mounted on a printing machine without development, which comprise a substrate provided thereon, in order, an ink-receiving layer and a hydrophilic layer mainly composed of colloid, for example, silica, crosslinked with a crosslinking agent such as aminopropyltriethoxysilane. In the hydrophilic layer, it is attempted that resistance to printing stain is enhanced by reducing the amount of hydrocarbon group as small as possible and press life is improved by crosslinking the colloid with a crosslinking agent.

However, according to the above-described technique, press life is insufficient as several thousands of sheets. Hitherto known digital direct process-less printing plates utilizing ablation had a problem of being deteriorated in either stain resistance or press life, which are essential requirements in printing, because of difficulties in realizing the process-less technique.

It is describe in Japanese Patent Laid-Open No. 96936/2001 that a heat-sensitive lithographic printing plate precursor comprising a substrate having an ink-receptive surface or an ink-receiving layer coated thereon a three dimensionally crosslinked hydrophilic layer and a water-soluble overcoat layer in this order, wherein the hydrophilic layer comprises a colloid of an oxide or hydroxide of at least one element selected from a group consisting of beryllium, magnesium, aluminum, silicon, titanium, boron, germanium, tin, zirconium, iron, vanadium, antimony and a transition metal, and a hydrophilic resin and the heated area of the hydrophilic layer is capable of being readily eliminated with dampening water or ink in at the time of printing allows the compatibility between press life and stain resistance in a digital direct process-less printing plate. However, it has been found that further improvements in ink receptivity at the beginning of printing in order to reduce spoilage and sensitivity are required even in such a heat-sensitive lithographic printing plate precursor.

SUMMARY OF THE INVENTION

Accordingly, an object of the present invention is to meet the forgoing requirements. Specifically, the object of the present invention is to provide a heat-sensitive lithographic printing plate precursor capable of being directly mounted on a printing machine without being subjected to processing after imagewise exposure to conduct printing, which is excellent in press life and stain resistance and is further improved in ink receptivity at the beginning of printing and sensitivity.

Other objects of the invention will become apparent from the following description.

As a result of the extensive investigations, it has been found that the above objects can be achieved by using a polyacrylic acid having a weight-average molecular weight of more than 50,000 as a hydrophilic resin of a hydrophilic layer and adjusting amounts of the polyacrylic acid and a colloidal particulate oxide or hydroxide of an element, for example, silicon to complete the present invention.

Specifically, the present invention includes the following items.

1. A heat-sensitive lithographic printing plate precursor comprising a support having provided thereon (A) an ink-receiving layer and (B) a hydrophilic layer comprising 80 to 99 parts by weight of a colloidal particulate oxide or hydroxide of at least one element selected from a group consisting of beryllium, magnesium, aluminum, silicon, titanium, boron, germanium, tin, zirconium, iron, vanadium, antimony and a transition metal, and 1 to 20 parts by weight of a polyacrylic acid having a weight-average molecular weight of more than 50,000, and at least one of the ink-receiving layer and the hydrophilic layer including a light-heat converting agent.

2. A heat-sensitive lithographic printing plate precursor comprising a support having provided thereon (A) an ink-receiving layer, (B) the hydrophilic layer described in item 1 above and (C) a water-soluble overcoat layer, and at least one of the ink-receiving layer, the hydrophilic layer and the water-soluble overcoat layer including a light-heat converting agent.

DETAILED DESCRIPTION OF THE INVENTION

In the heat-sensitive lithographic printing plate precursor of the present invention, the following effects are achieved by the use of a high molecular hydrophilic resin (polyacrylic acid) in the hydrophilic layer thereof.

(1) Interacting points between colloidal particles and the hydrophilic resin are increased so that the resulting printing plate has an improved dampening water resistance, whereby press life in the non-image area is improved, (2) Because of increasing viscosity of a coating solution, a preferable coating property can be obtained, whereby a heat-sensitive lithographic printing plate precursor having an excellent coated surface condition can be provided, resulting in the production of printed maters excellent in dot quality, (3) An amount of scattering scum due to the destruction of the hydrophilic layer upon imagewise exposure is suppressed so that the exposure can be effected without staining an optical system, and (4) By suppressing the amount of scattering scum, staining due to re-adhesion of the scum to the non-image area can be prevented, resulting in achieving the effect excellent in stain resistance.

The present invention will be described in more detail below.

The support for use in the present invention is a plate-shaped material having a dimensional stability. Examples of the support include paper, paper laminated with a lipophilic plastic (e.g., polyethylene, polypropylene or polystyrene), metal plate (e.g., aluminum, zinc, copper, nickel or stainless steel plate), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, or polyvinyl acetal), and paper or plastic film laminated or deposited with the foregoing metal.

Preferable supports include a polyethylene terephthalate film, a polycarbonate film, an aluminum or steel plate, and an aluminum or steel plate laminated with a lipophilic plastic film.

The aluminum plate used in the present invention includes a pure aluminum plate, an alloy plate mainly comprising aluminum and a trace amount of a foreign element, and an aluminum or aluminum alloy sheet laminated with a plastic film. Examples of the foreign element included in the aluminum alloy include silicon, iron, manganese, copper, magnesium, chromium, zinc, bismuth, nickel, and titanium. The content of foreign element in the alloy is at most 10% by weight. An aluminum plate obtained from an aluminum ingot produced by a DC casting method and an aluminum ingot produced by a continuous casting method may be used. Aluminum plates comprising conventionally known and used materials can also be appropriately utilized as the aluminum plate for the present invention.

The thickness of the support used in the present invention is 0.05 mm to 0.6 mm, preferably 0.1 mm to 0.4 mm, and more preferably 0.15 mm to 0.3 mm.

Prior to using an aluminum plate, the aluminum plate is preferably subjected to a surface treatment, for example, surface roughening or anodizing. By such a surface treatment, adhesion of the aluminum plate to the ink-receiving layer can be readily secured.

The surface roughening treatment of an aluminum plate surface can be performed according to various methods. For example, the surface roughening treatment can be carried out by a mechanical surface roughening method, a method comprising surface roughening by electrochemically dissolving the surface or a method comprising chemically dissolving the surface selectively. As the mechanical surface roughening method, a known method, for example, a ball graining method, a brush graining method, a blast graining method or a buff graining method can be used. As the chemical surface roughening method, a method comprising immersing an aluminum plate in a saturated aqueous solution of an aluminum salt of a mineral acid as described in Japanese Patent Laid-Open No. 31187/1979 is suitable. As the electrochemical surface roughening method, a method wherein an aluminum plate is treated in an electrolyte containing an acid, e.g., hydrochloric acid or nitric acid by means of an alternative current or a direct current. Further, an electrolytic surface roughening method using a mixed acid as disclosed in Japanese Patent Laid-Open No. 63902/1979 also may be utilized.

The surface roughening according to the method as described above is preferably conducted in such a range that a centerline average roughness (Ra) is 0.2 to 1.0 $\mu$m.

The surface roughened aluminum plate is subjected to an alkali etching treatment using an aqueous solution of potassium hydroxide, sodium hydroxide or the like, and further subjected to a neutralizing treatment, if desired. The plate is further subjected to an anodizing treatment for improving abrasion resistance, if desired.

As an electrolyte used in the anodizing treatment of aluminum plate, various electrolytes forming a porous oxidized film can be employed. Ordinarily, sulfuric acid, hydrochloric acid, oxalic acid, chromic acid or a mixed acid thereof can be used as the electrolyte. The concentration of electrolyte is appropriately determined depending upon a kind of the electrolyte used.

Conditions of the anodizing treatment may be varied depending upon the electrolyte to be used and they cannot be defined simply. However, in general, the following treatment conditions are appropriately employed: a solution having a concentration of an electrolyte of 1 to 80% by weight, a liquid temperature of 5 to 70° C., a current density of 5 to 60 A/dm$^2$, a voltage of 1 to 100 V, and an electrolysis time of 10 seconds to 5 minutes.

An amount of the oxidized film is preferably 1.0 to 5.0 g/m$^2$, more preferably 1.5 to 4.0 g/m$^2$.

The aluminum plate subjected to the surface treatment and having the anodized film formed thereon as described above can be used as it is as the support in the invention. However, in order to achieve further improvements, for example, in adhesion to a layer provided thereon and heat insulation, an enlargement treatment of micro pores of the anodized film, a sealing treatment of micro pores of the anodized film and a surface hydrophilic treatment by immersing the plate in an aqueous solution containing a hydrophilic compound, as described in Japanese Patent Laid-Open Nos. 253181/2001 and 322365/2001 may be appropriately performed.

Examples of the hydrophilic compound suitably used for the hydrophilic treatment include polyvinyl phosphonic acid, a compound having a sulfonic group, a saccharide compound, citric acid, an alkali metal silicate, potassium fluorozirconate and a phosphate/inorganic fluorine compound.

Into the ink-receiving layer of the present invention, a solvent-soluble lipophilic organic polymer having a film-forming property is incorporated.

Examples of the useful organic polymer include polyesters, polyurethanes, polyureas, polyimides, polysiloxanes, polycarbonates, phenoxy resins, epoxy resins, phenol-formaldehyde resins, alkylphenol-formaldehyde resins, polyvinylacetates, acrylic resins and copolymers thereof, polyvinyl phenols, polyvinyl halogenated phenols, methacrylic resins and copolymers thereof, acrylamide copolymers, methacrylamide copolymers, polyvinyl formals, polyamides, polyvinyl butyrals, polystyrenes, cellulose ester resins, polyvinyl chlorides and polyvinylidene chlorides.

Of these compounds, a resin having a hydroxy group, a carboxy group, a sulfonamido group or a trialkoxysilyl group in the side chain thereof is preferable because such a resin exhibits excellent adhesion to the support and the upper hydrophilic layer and can be readily cured with a crosslinking agent, if desired. Acrylonitrile copolymers, polyurethanes and copolymers having sulfonamide groups in the side chain thereof and copolymers having hydroxy groups in the side chain thereof each photo-cured with a diazo resin are also preferably used.

Further, novolak resins and resol resins comprising condensates of formaldehyde with a phenol compound, for example, phenol, cresol (m-cresol, p-cresol, m/p-mixed cresol), phenol/cresol (m-cresol, p-cresol, m/p-mixed cresol), phenol-modified xylene, tert-butylphenol, octylphenol, resorcinol, pyrogallol, catechol, chlorophenol (m-Cl, p-Cl), bromophenol (m-Br, p-Br), salicylic acid or phloroglucinol, and condensed resins of the foregoing phenol compound with acetone are useful.

Other preferable polymer compounds include copolymers each containing, as a constituent unit, a monomer shown in the following items (1) to (12) and a weight average molecular weight of 10,000 to 200,000.

(1) Acrylamides, methacrylamides, acrylic esters and methacrylic esters each having an aromatic hydroxy group and hydroxystyrenes, for example, N-(4-hydroxyphenyl) acrylamide, N-(4-hydroxyphenyl)methacrylamide, o-, m- or p-hydroxystyrene or o-, m- or p-hydroxyphenyl acrylate or methacrylate, (2) Acrylic esters and methacrylic esters each having aliphatic hydroxyl group, for example, 2-hydroxyethyl acrylate or 2-hydroxyethyl methacrylate, (3) (Substituted) acrylic esters, for example, methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate or N,N-dimethylaminoethyl acrylate, (4) (Substituted) methacrylic esters, for example, methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate or N,N-dimethylaminoethyl methacrylate, (5) Acrylamides or methacrylamides, for example, acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide or N-ethyl-N-phenylmethacrylamide, (6) Vinylethers, for example, ethyl vinyl ether, 2-chloroethyl vinyl ether, hydroxyethyl vinyl ether, propyl vinyl ether, butyl vinyl ether, octyl vinyl ether or phenyl vinyl ether, (7) Vinylesters, for example, vinyl acetate, vinyl chloroacetate, vinyl butyrate or vinyl benzoate, (8) Styrenes, for example, styrene, methylstyrene or chloromethylstyrene, (9) Vinyl ketones, for example, methyl vinyl ketone, ethyl vinyl ketone, propyl vinyl ketone or phenyl vinyl ketone,

(10) Olefins, for example, ethylene, propylene, isobutylene, butadiene or isoprene,

(11) N-vinyl pyrrolidone, N-vinyl carbazole, 4-vinyl pyridine, acrylonitrile or methacrylonitrile,

(12) Acrylamides, for example, N-(o-aminosulfonylphenyl)acrylamide, N-(m-aminosulfonylphenyl)acrylamide, N-(p-aminosulfonylphenyl)acrylamide, N-[1-(3-aminosulfonyl)naphthyl]acrylamide or N-(2-aminosulfonylethyl) acrylamide; methacrylamides, for example, N-(o-aminosulfonylphenyl)methacrylamide, N-(m-aminosulfonylphenyl)methacrylamide, N-(p-aminosulfonylphenyl) methacrylamide, N-[1-(3-aminosulfonyl)naphthyl] methacrylamide or N-(2-aminosulfonylethyl) methacrylamide; unsaturated sulfonamides of acrylic ester, for example, o-aminosulfonylphenyl acrylate, m-aminosulfonylphenyl acrylate, p-aminosulfonylphenyl acrylate, 1-(3-aminosulfonylphenylnaphtyl)acrylate; or unsaturated sulfonamides of methacrylic ester, for example, o-aminosulfonylphenyl methacrylate, m-aminosulfonylphenyl methacrylate, p-aminosulfonylphenyl methacrylate or 1-(3-aminosulfonylphenylnaphtyl)methacrylate.

To the ink-receiving layer of the present invention, other additives, for example, a crosslinking agent, an adhesion assistant, a colorant, inorganic or organic fine particles, a coated surface condition improving agent or a plasticizer may be added, if desired.

Into the ink-receiving layer, a light-heat converting agent for increasing sensitivity or a thermally color-forming or thermally decoloring additive for forming a printout image after the imagewise exposure may also be incorporated, if desired.

The crosslinking agent for crosslinking the organic polymer includes specifically a diazo resin, an aromatic azide compound, an epoxy resin, an isocyanate compound, a block isocyanate compound, an initial hydrolysis condensate of a tetraalkoxy silicon, glyoxal, an aldehyde compound and a methylol compound.

As the adhesion assistant, the foregoing diazo resin is excellent in adhesion to the support and the hydrophilic layer. A silane coupling agent, an isocyanate compound and a titanium-based coupling agent are also useful.

Conventional dyes and pigments are used as the coloring agent. Specifically, Rhodamine 6G chlorides, Rhodamine B chlorides, Crystal Violet, Malachite Green oxalate, oxazine-4-perch lorate, quinizarin, 2-(α-naphthyl)-5-phenyloxazole and cummalin-4 are exemplified. Other examples of the dye include triphenylmethane dyes, diphenylmethane dyes, oxazine dyes, xanthene dyes, iminonaphthoquinone dyes, azomethine dyes and anthraquinone dyes, typically represented by Oil Yellow #101, Oil Yellow#103, Oil Pink #312, Oil Green BG, Oil Blue BOS, Oil Blue #603, Oil Black BY, Oil Black BS, Oil Black T-505 (which are produced by Orient Chemical Industry Co., Ltd.), Victoria Pure Blue, Crystal Violet (CI42555), Methyl Violet (CI142535), Ethyl Violet, Methylene Blue (CI152015), Patent Pure Blue (produced by Sumitomo Mikuni Kagaku K.K.), Brilliant Blue, Methyl Green, Erythrosine B, basic Fuchsine, m-cresol purple, Auramine, 4-p-diethylaminophenyliminonaphthoquinone or cyano-p-diethylaminophenylacetanilide, or dyes described in Japanese Patent Laid-Open Nos. 293247/1987 and 179290/1995.

When the above-described colorant is added to the ink-receiving layer, the amount thereof is ordinarily about 0.02 to 10% by weight, preferably about 0.1 to 5% by weight, based on the total solid content of the ink-receiving layer.

A fluorine-based surfactant and a silicone-based surfactant, which are well known as the coated surface condition improving agent, may be used. Specifically, a surfactant having a perfluoroalkyl group or a dimethylsiloxane group is useful for controlling a coated surface condition.

Examples of the organic or inorganic fine particles for use in the present invention include colloidal silica or colloidal aluminum having a particle size of 10 nm to 100 nm, inert particles having a particle size larger than that of such a colloid, e.g., silica particles, silica particles having surfaces rendered hydrophobic, alumina particles, titanium dioxide particles, other heavy metal particles, clay and talc. The addition of the inorganic or organic fine particles to the ink-receiving layer can provide such an effect that adhesion of the ink-receiving layer to the upper hydrophilic layer is improved, whereby press life of the resulting printing plate is improved. An amount of the fine particles added to the ink-receiving layer is ordinarily 80% by weight or less, preferably 40% by weight or less, based on the total solid content of the ink-receiving layer.

The plasticizer for imparting flexibility to the coated film can be added to the ink-receiving layer of the present invention, if desired. Examples of the plasticizer used include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate and an oligomer or polymer of acrylic acid or methacrylic acid.

In order to clearly distinguish an image area from a non-image area upon exposure, it is preferable to add the color-forming or decoloring compound in the ink-receiving layer of the present invention. For example, a heat-acid generating agent such as a diazo compound or a diphenyl iodonium salt is used together with a leuco dye (e.g., leuco Malachite Green, leuco Crystal Violet or Crystal Violet lactone) or a dye changeable its color depending upon pH (for example, Ethyl Violet, Victoria Pure Blue BOH) is used. Further, the combination of an acid-generating dye with an acidic binder as described in European Patent 897,134 is also effective. In such a case, the bond in the associated state forming the dye is cleaved by heating to form the lactone form so that the dye changes from a colored state to a colorless state.

An amount of the color-forming or decoloring compound added to the ink-receiving layer is ordinarily 10% by weight or less, preferably 5% by weight or less, based on the total solid content of the ink-receiving layer.

As a solvent for coating the ink-receiving layer, alcohols (e.g., methanol, ethanol, propyl alcohol, ethylene glycol, diethylene glycol, propylene glycol, dipropylene glycol, ethylene glycol monomethyl ether, propylene glycol monomethyl ether or ethylene glycol monoethyl ether), ethers (e.g., tetrahydrofuran, ethylene glycol dimethyl ether, propylene glycol dimethyl ether or tetrahydropyran), ketones (e.g., acetone, methyl ethyl ketone or acetyl acetone), esters (e.g., methyl acetate, ethylene glycol monomethyl ether monoacetate, methyl lactate, ethyl lactate or γ-butyrolactone), or amides (e.g., formamide, N-methyl formamide, pyrrolidone or N-methylpyrrolidone) can be used. The solvents may be used alone or as a mixture thereof. In case of preparing a coating solution, a concentration of the constituent components for forming the ink-receiving layer (total solid content including additives) in the solvent is preferably 1 to 50% by weight. In addition to the coating from an organic solvent as described above, a film can also be formed from an aqueous emulsion. In such a case, the concentration is preferably 5 to 50% by weight.

A thickness of the ink-receiving layer of the present invention after being coated and dried is not particularly limited. When the ink-receiving layer is provided on a metal plate, it also functions as a heat-insulating layer. Thus, the thickness thereof is preferably 0.1 $\mu$m or more, more preferably 0.2 $\mu$m or more. In a case where a lipophilic plastic film is used as the support, it is enough that the ink-receiving layer functions as an adhesive layer to the upper hydrophilic layer. Therefore, the coating amount is smaller than that in the case of metal plate. The thickness is preferably 0.05 $\mu$m or more.

The hydrophilic layer for use in the present invention is a layer insoluble in dampening water at the lithographic printing using the dampening water and ink. The hydrophilic layer is formed by coating a solution containing colloidal particulate oxide or hydroxide of at least one element selected from a group consisting of beryllium, magnesium, aluminum, silicon, titanium, boron, germanium, tin, zirconium, iron, vanadium, antimony and a transition metal, and a polyacrylic acid.

Of the elements constituting the colloidal particulate oxide or hydroxide used in the present invention, aluminum, silicon, titanium and zirconium are particularly preferred.

With respect to size of the colloid used in the present invention, spherical particles having a diameter of 5 to 100 nm is preferred in the case of silica. Colloid particles in the form of a pearl necklace wherein spherical particles having a particle diameter of 10 to 50 nm are connected in a length of 50 to 400 nm can also be used. As in oxide or hydroxide colloid of aluminum, a feather-shaped colloid having a size of 100 nm×10 nm is also effective.

The colloids can be produced according to various methods, for example, hydrolysis of halides or alkoxy compounds of the foregoing elements or condensation of hydroxides of the foregoing elements.

Also, a sol is directly produced from di, tri and/or tetraalkoxysilane by hydrolysis and condensation in the presence of an acid catalyst and the sol produced can be applied to form the hydrophilic layer. In case of using the sol, a more strengthened hydrophilic three-dimensionally crosslinked film can be obtained.

Commercially available products, for example, those produced by Nissan Chemical Industry Co., Ltd. can also be used.

A polyacrylic acid for use in the hydrophilic layer of the present invention has a weight-average molecular weight of more than 50,000. When the polyacrylic acid having a weight-average molecular weight of less than 50,000 is used, while it exhibits good compatibility with colloidal particles, e.g., silica, a number of interaction points per one polymer chain is small so that the film strength of the coating layer is insufficient. Thus, a remarkable improvement in press life cannot be recognized. Further, because of lowering of the viscosity of coating solution, deterioration in a coated surface condition of the hydrophilic layer, for example, unevenness due to air blowing for drying may occur. Such a phenomenon may also cause degradation of press life and uniform reproduction of dots.

The upper limit of weight-average molecular weight of polyacrylic acid used in the hydrophilic layer is preferably 5,000,000. The weight-average molecular weight of polyacrylic acid used is preferably from 60,000 to 2,000,000 and more preferably from 100,000 to 1,000,000.

A proportion of the polyacrylic acid to the colloidal particulate oxide or hydroxide in the hydrophilic layer is 1 to 20 parts by weight to 99 to 80% by weight. In such a proportion, good press life, stain resistance, sensitivity, ink receptivity at the beginning of printing can be obtained.

When the amount of polyacrylic acid added is larger than the upper limit of the range, the sensitivity and ink receptivity at the beginning of printing may be deteriorated. When the amount of polyacrylic acid added is smaller than the lower limit of the range, the sensitivity and press life may be deteriorated.

TO the hydrophilic layer of the present invention, a crosslinking agent accelerating crosslinking of the colloid may be added in addition to the colloid and polyacrylic acid. The crosslinking agent for colloid preferably includes an initial hydrolysis condensate of tetraalkoxysilane, trialkoxysilylpropyl-N,N,N-trialkylammonium halide and aminopropyltrialkoxysilane. An amount of the crosslinking agent is preferably 5% by weight or less of the total solid content of the hydrophilic layer.

The hydrophilic layer containing the above respective components is provided by coating a solution prepared by dissolving or dispersing the respective components in a solvent. Water and a low-boiling point alcohol, for example, methanol, ethanol or propanol can be used as the main solvent of the coating solution for hydrophilic layer. The solvents may be used alone or in combination of two or more thereof.

To the hydrophilic layer of the present invention, a well-known fluorine-based surfactant, silicone-based surfactant or polyoxyethylene-based surfactant may further be added for improving the surface condition of the coating.

A thickness of the hydrophilic layer of the present invention is preferably 0.1 μm to 3 μm. Ablation and press life are improved in such a range of the thickness of the hydrophilic layer.

The heat-sensitive lithographic printing plate precursor of the present invention may be provided with an overcoat layer mainly comprising a water-soluble resin on the hydrophilic layer for suppressing scattering of scum due to ablation and for preventing staining of the hydrophilic layer with lipophilic materials.

The water-soluble overcoat layer for use in the present invention can be readily removed at the time of printing and comprises a resin selected from water-soluble organic polymer compounds. The water-soluble organic polymer compound used has a film-forming ability to form a film upon coating and drying. Specific examples of the water-soluble organic polymer compound include polyvinyl acetate (having a hydrolysis rate of 65% or more), polyacrylic acid, alkali metal salt or amine salt thereof, polyacrylic acid copolymer, alkali metal salt or amine salt thereof, polymethacrylic acid, alkali metal salt or amine salt thereof, polymethacrylic acid copolymer, alkali metal salt or amine salt thereof, polyacrylamide, copolymer thereof, polyhydroxyethyl acrylate, polyvinyl pyrrolidone, copolymer thereof, polyvinyl methyl ether, vinyl methyl ether/maleic anhydride copolymer, poly-2-acrylamido-2-methyl-1-propanesulfonic acid, alkali metal salt or amine salt thereof, poly-2-methacrylamido-2-methyl-1-propanesulfonic acid copolymer, alkali metal salt or amine salt thereof, gum arabic, cellulose derivative (e.g., carboxymethylcellulose, carboxyethylcellulose or methylcellulose), modified product thereof, white dextrin, pullulan, and enzyme-decomposed etherified dextrin. The resins may be used as a mixture of two or more thereof, if desired.

For the purpose of ensuring coating uniformity, a nonionic surfactant may further be added to the overcoat layer in case of coating an aqueous solution. Specific examples of the nonionic surfactant include sorbitan tristearate, sorbitan monopalmitate, sorbitan trioleate, monoglyceride stearate, polyoxyethylene nonyl phenyl ether and polyoxyethylene dodecyl ether.

A content of the nonionic surfactant is preferably 0.05 to 5% by weight, more preferably 1 to 3% by weight, based on the total solid content of the overcoat layer.

A thickness of the overcoat layer used in the present invention is preferably 0.05 μm to 4.0 μm, more preferably 0.1 μm to 1.0 μm. In such a range of the thickness, desired suppression of scattering of scum due to ablation and prevention of staining of the hydrophilic layer can be achieved without deteriorating dissolution-elimination property of the overcoat layer with dampening water at the printing.

In the present invention, a light-heat converting agent having a function of generating heat upon absorption of infrared ray is added to at least one of the ink-receiving layer, hydrophilic layer and overcoat layer for increasing sensitivity to infrared ray.

The light-heat converting agent is not particularly limited as long as it can absorb a light having a wavelength of 700 nm or more. Various pigments and dyes can be used as the light-heat converting agents. As the pigment, commercially available pigments and pigments described in *Colour Index* (C.I.), *Saishin Ganryo Binran* (*Latest Pigment Handbook*), edited by Nippon Ganryo Gijutsu Kyokai (1977), *Saishin Ganryo Oyo Gijutsu* (*Latest Pigment Application Techniques*), CMC Publishing (1986) and *Insatu-inki Gijutsu* (*Printing Ink Techniques*), CMC Publishing (1984) can be utilized.

The pigments include black pigments, brown pigments, red pigments, violet pigments, blue pigments, green pigments, fluorescent pigments, metal powder pigments and polymer-bonding dyestuffs. Specifically, insoluble azo pigments, azo lake pigments, condensed azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, Reichardt's dyes, azine pigments, nitroso pigments, nitro pigments, natural pigments, fluorescent pigments, inorganic pigments and carbon black pigments can be used.

The pigment may be used with or without being subjected to a surface treatment. The surface treatment method includes a method of coating a surface of pigment with a hydrophilic resin or a lipophilic resin, a method of adhering a surfactant to a surface of pigment, a method of bonding a reactive substance (e.g., silica sol, alumina sol, silane coupling agent, epoxy compound or isocyanate compound) to a surface of pigment. The surface treatment methods are described in *Kinzokusekken no Seishitu to Oyo* (*Properties and Applications of Metal Soap*), published by Saiwai Shobo, *Insatu-inki Gijutsu* (*Printing Ink Techniques*), CMC Publishing (1984) and *Saishin Ganryo Oyo Gijutsu* (*Latest Pigment Application Techniques*), CMC Publishing (1986). Of the pigments, those absorbing infrared ray are preferably used because they are suitable for the utilization of laser emitting infrared ray. As such a pigment that absorbs infrared ray, carbon black is particularly preferable.

As a pigment added to the hydrophilic layer and the overcoat layer of the present invention, carbon black having a surface coated with a hydrophilic resin or silica sol so as to be readily dispersed with a water-soluble or hydrophilic resin and not so as to deteriorate the hydrophilic property is useful.

A particle size of the pigment is preferably in a range of from 0.01 μm to 1 μm, more preferably in a range of from 0.01 μm to 0.5 μm. In order to disperse the pigment, known dispersion techniques used for the production of ink or toner can be used. Examples of the dispersing machine include an ultrasonic disperser, a sand mill, an attritor, a pearl mill, a super mill, a ball mill, an impeller, a disperser, a KD mill, a colloid mill, a Dynatron, a tree-rod roll mill and a pressure kneader. The dispersing machines are described in Saishin Ganryo Oyo Gijutsu (Latest Pigment Application Techniques), CMC Publishing (1986).

Commercially available dyes and known dyes as described in literature (for example, *Senryo Binran* (*Dye Handbook*), edited by Yuki Gosei Kagaku Kyokai (1970), *Kin-Sekigai Kyushu Shikiso* (*Near Infrared Absorption Dyestuffs*) in *Kagaku Kogyo* (*Chemical industry*), pp 45 to 51, May (1986) or 90-*Nendai Kinousei Shikiso no Kaihatsu to Shijyodoko* (*Development and Market Trend of* 1990*'s Functional Dyes*), Chapter 2, Item 2. 3 (1990), published by CMC and patents can be utilized. Specifically, infrared ray absorbing dyes, for example, azo dyes, metal complex azo dyes, pyrazolone azo dyes, anthraquinone dyes, phthalocyanine dyes, carbonium dyes, quinoneimine dyes, polymethine dyes and cyanine dyes are preferably used.

Examples of the infrared ray absorbing dye include cyanine dyes described in Japanese Patent Laid-Open Nos. 125246/1983, 84356/1984 and 78787/1985, methine dyes described in Japanese Patent Laid-Open Nos. 173696/1983, 181690/1983 and 194595/1983, naphthoquinone dyes described in Japanese Patent Laid-Open Nos. 112793/1983, 224793/1983, 48187/1984, 73996/1984, 52940/1985 and 63744/1985, etc., etc., squarylium dyes described in Japanese Patent Laid-Open No. 112792/1983, cyanine dyes described in British Patent 434,875, dyes described in U.S. Pat. No. 4,756,993, cyanine dyes described in U.S. Pat. No. 4,973,572, dyes described in Japanese Patent Laid-Open No. 268512/1998, and phthalocyanine compounds described in Japanese Patent Laid-Open No. 235883/1999.

Further, near infrared ray absorbing sensitizers described in U.S. Pat. No. 5,156,938, substituted arylbenzo(thio) pyrylium salts described in U.S. Pat. No. 3,881,924, trimethinethiapyrylium salts described in Japanese Patent Laid-Open No. 142645/1982 (corresponding to U.S. Pat. No. 4,327,169), pyrylium compounds described in Japanese Patent Laid-Open Nos. 181051/1983, 220143/1983, 41363/1984, 84248/1984, 84249/1984, 146063/1989 and 146061/1989, cyanine dyes described in Japanese Patent Laid-Open No. 216146/1984, pentamethinethiopyrylium salts described in U.S. Pat. No. 4,283,475, pyrylium compounds described in Japanese Patent Publication Nos. 13514/1993 and 19702/1993, Epolight III-178, Epolight III-130 and Epolight III-125 (produced by Epolin Inc.) are also preferably used as the dyes.

Of the dyes, particularly preferable dyes for adding to the overcoat layer and hydrophilic layer are water-soluble dyes. Specific examples of such dyes are illustrated below.

(IR-1)

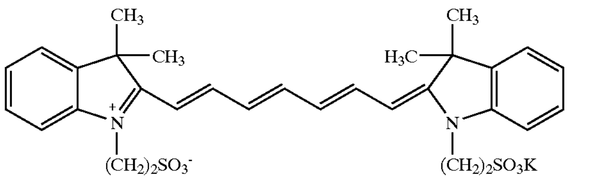

(IR-2)

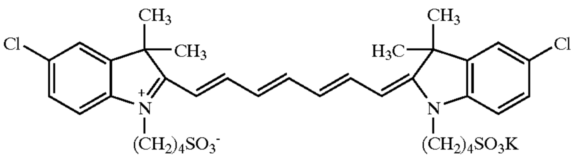

(IR-3)

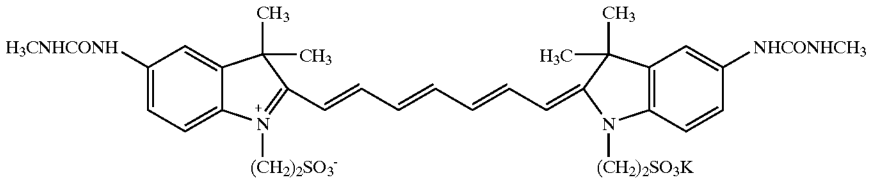

(IR-4)

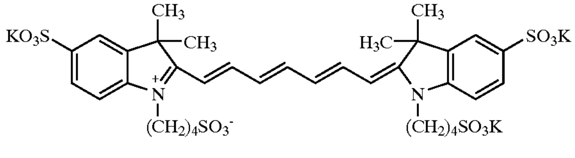

(IR-5)

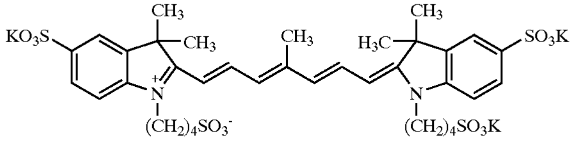

(IR-6)

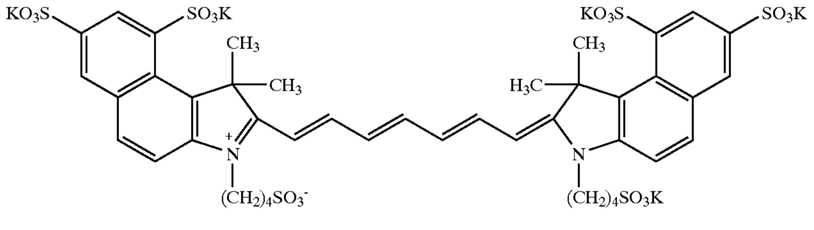

-continued
(IR-7)
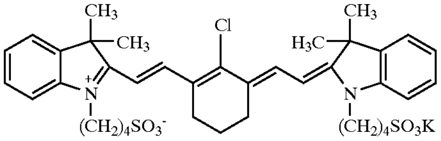
(IR-8)
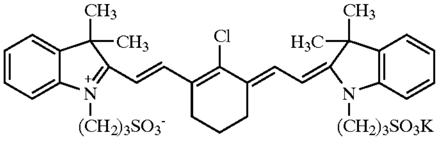
(IR-9)
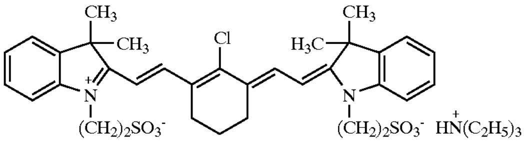
(IR-10)
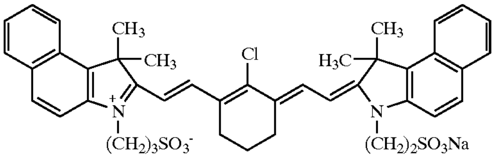
(IR-11)
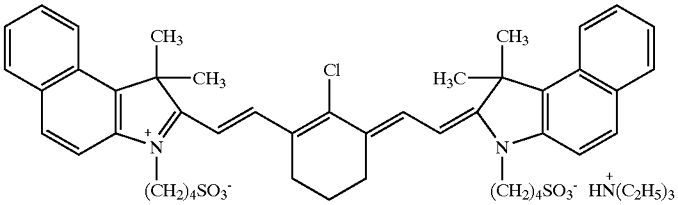
A dye used in the ink-receiving layer of the present invention includes the foregoing infrared ray absorbing dyes. However, more lipophilic dyes are preferably used. Examples of the more preferable dye are illustrated below.
(IR-21)
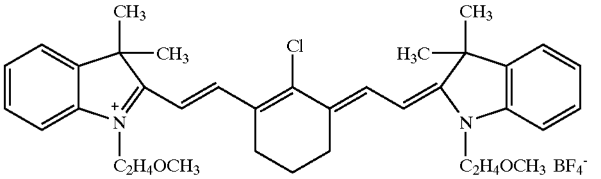
(IR-22)
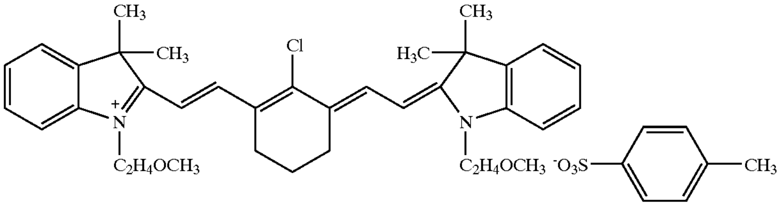
(IR-23)
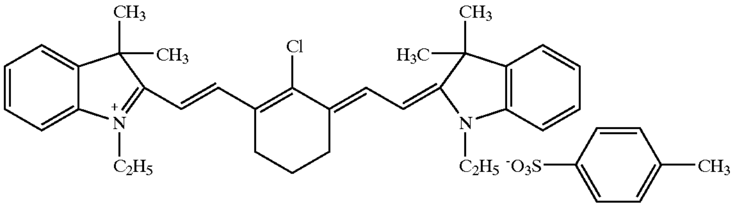
(IR-24)
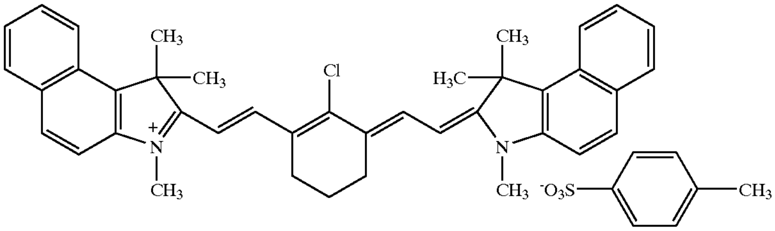

-continued (IR-25)

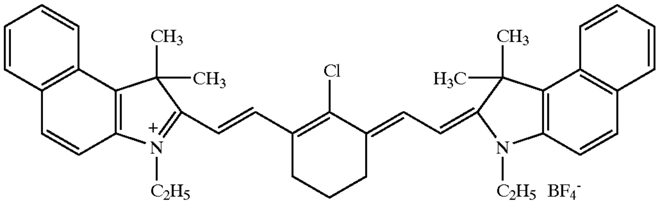

(IR-26)

M = VO, R = i-$C_5H_{11}$

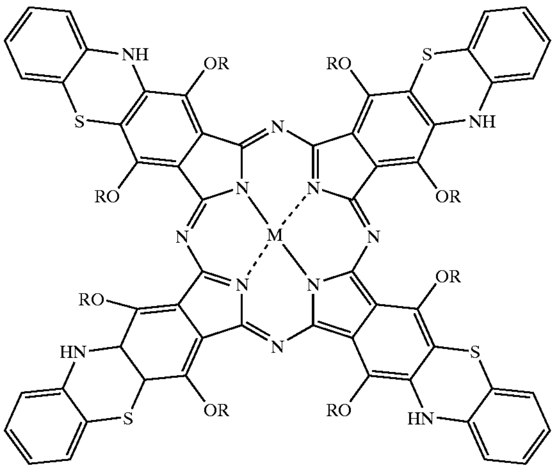

(IR-27)

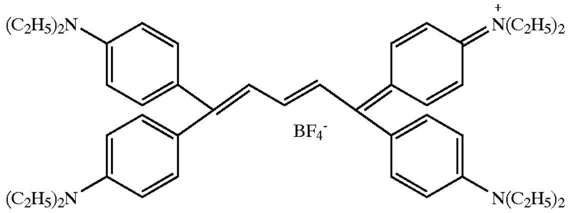

An amount of the light-heat converting agent added in the hydrophilic layer is 1 to 50% by weight, preferably 2 to 20% by weight, based on the total solid content of the layer. In the overcoat layer, the amount of light-heat converting agent added is 1 to 70% by weight, preferably 2 to 50% by weight, based on the total solid content of the layer. In a case where the light-heat converting agent is a dye, the amount of light-heat converting agent added is particularly preferably 2 to 30% by weight. In a case where the light-heat converting agent is a pigment, the amount of light-heat converting agent added is particularly preferably 20 to 50% by weight. An amount of the light-heat converting agent added to the ink-receiving layer is preferably 20% by weight or less, more preferably 15% by weight or less, based on the total solid content of the ink-receiving layer.

In the amounts in these ranges, good sensitivity is obtained without impairing film strength of the respective layers.

In the heat-sensitive lithographic printing plate precursor of the present invention, the formation of image is conducted with heat. Specifically, direct imagewise recording by means of, for example, a thermal recording head, scanning exposure by an infrared laser, high illumination flash exposure using a xenon discharge lamp or exposure by an infrared ray lamp can be used. Exposure with a solid high output infrared laser, for example, semiconductor laser or YAG laser, radiating infrared ray having a wavelength of 700 to 1200 nm is preferably used.

The imagewise exposed printing plate precursor of the present invention can be mounted on a printing machine without being subjected to any other treatments. Alternatively, it is also possible that after mounting the printing plate precursor on a printing machine, the printing plate precursor is exposed to a laser beam on the printing machine and then subjected to printing as it is.

By starting the printing using ink and dampening water, the overcoat layer and the exposed areas of the hydrophilic layer are removed with the dampening water and the ink is adhered on the ink-receiving layer positioned under the hydrophilic layer. Thus, printed matters can be obtained by feeding paper.

The present invention is described in more detail below with reference to the following examples, but the present invention should not be construed as being limited thereto.

EXAMPLE 1

Production of Aluminum Support

A 0.24 mm-thick rolled plate of JIS A1050 aluminum material containing aluminum 99.5% by weight, copper 0.01% by weight, titanium 0.03% by weight, iron 0.3% by weight and silicon 0.1% by weight was subjected to surface graining with a 20% by weight aqueous suspension of 400-mesh pumice stone (produced by Kyoritsu Yogyo K.K.) and a rotating nylon brush, and then thoroughly washed with water. The plate was immersed in a 15% by weight aqueous sodium hydroxide solution (containing 4.5% by weight of aluminum ion) to conduct etching so that a dissolution amount of aluminum became 5 g/m$^2$, and washed with running water. The plate was neutralized with a 1% by weight aqueous nitric acid solution. Then, the plate was subjected to an electrolytic surface roughening treatment in a 0.7% by weight aqueous nitric acid solution (containing 0.5% by weight of aluminum ion) by applying thereto a rectangular wave alternating waveform voltage having 10.5 V as an anode voltage and 9.3 V of a cathode voltage (current ratio r=0.90, current waveform described in Japanese Patent Publication No. 5796/1983) under a condition that electricity at the anode was 160 C/dm$^2$. After washing with water, the plate was immersed in a 10% by weight aqueous sodium hydroxide solution having temperature of 35° C. so that a dissolution amount of aluminum became 1 $g/m^2$, and then washed with water. Successively, the plate was subjected to desmutting by immersing in a 30% by weight aqueous sulfuric acid solution having temperature of 50° C. and washed with water. Further, the plate was subjected to a porous anodized film forming treatment in a 20% by weight aqueous sulfuric acid solution having temperature of 35° C. (containing 0.8% by weight of aluminum ion) using a direct current. Specifically, electrolysis was conducted at a current density of 13 $A/dm^2$ to prepare a support having an anodized film weight of 2.7 $g/m^2$ by controlling the electrolysis time.

The support thus obtained had a reflection density of 0.30 measured by a MACBETH REFLECTION DENSITOMETER RD 920 and a center-line average roughness (Ra) of 0.52 $\mu$m.

A coating solution for ink-receiving layer having the composition shown below was coated on the foregoing support by a bar coater so that an amount of the coating solution was 11.25 $ml/m^2$. Then, the coating was dried by heating at 100° C. for 1 minute to prepare an ink-receiving layer having a dry coverage of 0.40 $g/m^2$.

Coating Solution for Ink-Receiving Layer

| | |
|---|---|
| EPIKOTE 1100L (produced by Yuka Shell Epoxy Co., Ltd.) | 0.8 g |
| EPIKOTE 1001 (produced by Yuka Shell Epoxy Co., Ltd.) | 0.2 g |
| Light-heat converting agent (IR-24) | 0.2 g |
| Methyl ethyl ketone | 8 g |
| Propylene glycol monomethyl ether | 17 g |

Coating of Hydrophilic Layer

On the ink-receiving layer thus formed, a coating solution for hydrophilic layer (I) shown below was coated by means of a bar coater, and dried at 120° C. for 1 minute to prepare a hydrophilic layer having a dry coverage of 0.45 $g/m^2$.

Coating Solution for Hydrophilic Layer (I)

| | |
|---|---|
| Methanol silica (produced by Nissan Chemicals Industries, Ltd.; particle diameter of silica: 10 to 20 nm; colloid comprising methanol solution containing 30% by weight of silica) | 3 g |
| Methanol solution containing 5% by weight Of polyacrylic acid (weight-average molecular weight: 250,000) | 2 g |
| Methyl lactate | 1 g |
| Methanol | 17.53 g |

On the hydrophilic layer was coated a coating solution for overcoat layer having the composition shown below by means of a bar coater, followed by drying at 100° C. for 90 seconds. Thus, a heat-sensitive lithographic printing plate precursor having the overcoat layer having a dry coverage of 0.15 $g/m^2$ was obtained.

Coating Solution for Overcoat Layer

| | |
|---|---|
| 28% By weight aqueous solution of gum arabic | 1.5 g |
| Light-heat converting agent (Dye IR-10) | 0.042 g |
| Polyoxyethylene nonyl phenyl ether (aqueous solution containing 10% by weight of polyoxyethylene nonyl phenyl ether) | 0.168 g |
| Ion-exchanged water | 22 g |

The heat-sensitive lithographic printing plate precursor was exposed by means of TRENDSETTER produced by Creo Co., Ltd. (a plate setter loaded with a 40 W semiconductor laser having a wavelength of 830 nm) with energy of 200 $mJ/cm^2$. The exposed precursor was mounted on a printing machine (SOR-M produced by Heidelberg Co., Ltd.) as it was, without any other treatments, and dampening water composed of a plate etching solution (IF-102 produced by Fuji Photo Film Co., Ltd.)/water (volume ratio 4/100) and ink (GEOS-B Black produced by Dainippon Ink and Chemicals Inc.) were simultaneously supplied and high quality paper were fed to start printing. At sixth sheet from the beginning of printing, the ink completely adhered to the sheet and thereafter, 15,000 sheets of good printed matters free from stain were obtained.

EXAMPLES 2 AND 3

Heat-sensitive lithographic printing plate precursors were produced in the same manner as in Example 1, except that in place of the polyacrylic acid having a weight-average molecular weight of 250,000 used in Example 1, polyacrylic acid having a weight-average molecular weight of 60,000 and polyacrylic acid having a weight-average molecular weight of 1,250,000 were used in Examples 2 and 3, respectively.

The heat-sensitive lithographic printing plate precursors were exposed and subjected to printing in the same manner as in Example 1. As a result, it was found that in each of the lithographic printing plate precursors, ink adhered on paper before printing 6 sheets counted from the beginning of printing. Further, from each of the printing plates, 15,000 sheets of good printed matters free from stain could be obtained.

COMPARATIVE EXAMPLE 1

A heat-sensitive lithographic printing plate precursor for comparison was produced in the same manner as in Example 1 except for using a coating solution for hydrophilic layer (i) free from polyacrylic acid and having the composition shown below instead of the coating solution for hydrophilic layer of Example 1. The dry coverage of the hydrophilic layer was 0.45 $g/m^2$.

Coating Solution for Hydrophilic Layer (i) for Comparison

| | |
|---|---|
| Methanol silica (same as in Example 1) | 3.33 g |
| Methyl lactate | 1 g |
| Methanol | 19.2 g |

The heat-sensitive lithographic printing plate precursor for comparison was exposed using the plate setter same as in Example 1 and subjected to printing under the same printing conditions as in Example 1. As a result, it was found that an optimum exposure amount was 240 $mJ/cm^2$, a number of sheets used for the printing until ink completely adhered on paper was 30, and a number of sheets of printed matters (press life) was 3,000.

COMPARATIVE EXAMPLE 2

A heat-sensitive lithographic printing plate precursor for comparison was produced in the same manner as in Example 1 except for using a coating solution for hydrophilic layer (ii) containing polyacrylic acid of a low molecular weight and having the composition shown below instead of the coating solution for hydrophilic layer of Example 1. The dry coverage of the hydrophilic layer was 0.45 g/m$^2$.

Coating Solution for Hydrophilic Layer (ii) for Comparison)

| | |
|---|---|
| Methanol silica (same as in Example 1) | 3 g |
| Methanol solution containing 5% by weight of polyacrylic acid (weight-average molecular weight of 40,000) | 2 g |
| Methyl lactate | 1 g |
| Methanol | 17.53 g |

The heat-sensitive lithographic printing plate precursor for comparison was exposed using the plate setter same as in Example 1 and subjected to printing under the same printing conditions as in Example 1. As a result, it was found that an optimum exposure amount was 200 mJ/cm$^2$, a number of sheets used for the printing until ink completely adhered on paper was 6, and a number of sheets of printed matters (press life) was 8,000.

COMPARATIVE EXAMPLE 3

A heat-sensitive lithographic printing plate precursor for comparison was produced in the same manner as in Example 1 except for using a coating solution for hydrophilic layer (iii) having a high addition ratio of polyacrylic acid and having the composition shown below instead of the coating solution for hydrophilic layer of Example 1. The dry coverage of the hydrophilic layer was 0.45 g/m$^2$.

Coating Solution for Hydrophilic Layer (iii) for Comparison

| | |
|---|---|
| Methanol silica (same as in Example 1) | 2.1 g |
| Methanol solution containing 5% by weight of polyacrylic acid (weight-average molecular weight of 250,000) | 10.5 g |
| Methyl lactate | 1 g |
| Methanol | 15.86 g |

The heat-sensitive lithographic printing plate precursor for comparison was exposed using the plate setter same as in Example 1 and subjected to printing under the same printing conditions as in Example 1. As a result, it was found that an optimum exposure amount was 240 mJ/cm$^2$, a number of sheets used for the printing until ink completely adhered on paper was 6, and a number of sheets of printed matters (press life) was 3,000.

COMPARATIVE EXAMPLE 4

A heat-sensitive lithographic printing plate precursor for comparison was produced in the same manner as in Example 1 except for using a coating solution for hydrophilic layer (iv) containing a hydrophilic resin other than polyacrylic acid and having the composition shown below instead of the coating solution for hydrophilic layer of Example 1. The dry coverage of the hydrophilic layer was 0.45 g/m$^2$.

Coating Solution for Hydrophilic Layer (iv) for Comparison

| | |
|---|---|
| Methanol silica (same as in Example 1) | 3 g |
| Methanol solution containing 5% by weight of poly 2-hydroxyethyl methacrylate (weight-average molecular weight of 300,000) | 2 g |
| Methyl lactate | 1 g |
| Methanol | 17.53 g |

The heat-sensitive lithographic printing plate precursor for comparison was exposed using the plate setter same as in Example 1 and subjected to printing under the same printing conditions as in Example 1. As a result, it was found that an optimum exposure amount was 260 mJ/cm$^2$, a number of sheets used for the printing until ink completely adhered on paper was 45, and a number of sheets of printed matters (press life) was 15,000.

As described above, according to the heat-sensitive lithographic printing plate precursor of the present invention, the following effects are achieved by the use of a high molecular hydrophilic resin (polyacrylic acid) in the hydrophilic layer thereof.

(1) Interacting points between colloidal particles and the hydrophilic resin are increased so that the resulting printing plate has an improved dampening water resistance, whereby press life in the non-image area is improved, (2) Because of increasing viscosity of a coating solution, a preferable coating property can be obtained, whereby a heat-sensitive lithographic printing plate precursor having an excellent coated surface condition can be provided, resulting in the production of printed maters excellent in dot quality, (3) An amount of scattering scum due to the destruction of the hydrophilic layer upon imagewise exposure is suppressed so that the exposure can be effected without staining an optical system, and (4) By suppressing the amount of scattering scum, staining due to re-adhesion of the scum to the non-image area can be prevented, resulting in achieving the effect excellent in stain resistance.

According to the present invention, a heat-sensitive lithographic printing plate precursor capable of being directly mounted on a printing machine without being subjected to processing after imagewise exposure to conduct printing, which is excellent in press life and stain resistance and is further improved in ink receptivity at the beginning of printing and sensitivity is provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A heat-sensitive lithographic printing plate precursor comprising a support having provided thereon (A) an ink-receiving layer and (B) a hydrophilic layer comprising 80 to 99 parts by weight of a colloidal particulate oxide or hydroxide of at least one element selected from a group consisting of beryllium, magnesium, aluminum, silicon, titanium, boron, germanium, tin, zirconium, iron, vanadium, antimony and a transition metal, and 1 to 20 parts by weight of a polyacrylic acid having a weight-average molecular weight of more than 50,000, and at least one of the ink-receiving layer and the hydrophilic layer including a light-heat converting agent.

2. The heat-sensitive lithographic printing plate precursor as claimed in claim 1, wherein the ink-receiving layer comprises a solvent-soluble lipophilic organic polymer having a film-forming property.

3. The heat-sensitive lithographic printing plate precursor as claimed in claim 2, wherein the polymer is a resin having a hydroxy group, a carboxy group, a sulfonamido group or a trialkylsilyl group in the side chain thereof.

4. The heat-sensitive lithographic printing plate precursor as claimed in claim 1, wherein the polyacrylic acid contained in the hydrophilic layer has a weight-average molecular weight of not more than 5,000,000.

5. The heat-sensitive lithographic printing plate precursor as claimed in claim 1, wherein the hydrophilic layer further comprises a crosslinking agent of the colloidal particulate oxide or hydroxide.

6. The heat-sensitive lithographic printing plate precursor as claimed in claim 1, wherein the light-heat converting agent is an infrared ray absorbing dye.

7. The heat-sensitive lithographic printing plate precursor as claimed in claim 1, wherein the hydrophilic layer consists essentially of 80 to 99 parts by weight of a colloidal particulate oxide or hydroxide of at least one element selected from a group consisting of beryllium, magnesium, aluminum, silicon, titanium, boron, germanium, tin, zirconium, iron, vanadium, antimony and a transition metal, and 1 to 20 parts by weight of a polyacrylic acid having a weight-average molecular weight of more than 50,000.

8. The heat-sensitive lithographic printing plate precursor as claimed in claim 1, wherein the polyacrylic acid has a weight-average molecular weight of from 250,000 to 1,250,000.

9. A heat-sensitive lithographic printing plate precursor comprising a support having provided thereon (A) an ink-receiving layer, (B) a hydrophilic layer comprising 80 to 99 parts by weight of a colloidal particulate oxide or hydroxide of at least one element selected from a group consisting of beryllium, magnesium, aluminum, silicon, titanium, boron, germanium, tin, zirconium, iron, vanadium, antimony and a transition metal, and 1 to 20 parts by weight of a polyacrylic acid having a weight-average molecular weight of more than 50,000, and (C) a water-soluble overcoat layer, and at least one of the ink-receiving layer, the hydrophilic layer and the water-soluble overcoat layer including a light-heat converting agent.

10. The heat-sensitive lithographic printing plate precursor as claimed in claim 9, wherein the water-soluble overcoat layer comprises a water-soluble organic polymer compound.

11. The heat-sensitive lithographic printing plate precursor as claimed in claim 9, wherein the light-heat converting agent is an infrared ray absorbing dye.

12. The heat-sensitive lithographic printing plate precursor as claimed in claim 9, wherein the polyacrylic acid has a weight-average molecular weight of from 250,000 to 1,250,000.

13. A heat-sensitive lithographic printing plate precursor comprising a support having provided thereon (A) an ink-receiving layer and (B) a hydrophilic layer comprising 80 to 99 parts by weight of a colloidal particulate oxide or hydroxide of at least one element selected from a group consisting of beryllium, magnesium, aluminum, silicon, titanium, boron, germanium, tin, zirconium, iron, vanadium, antimony and a transition metal, and 1 to 20 parts by weight of a polyacrylic acid having a weight-average molecular weight of more than 50,000, and the ink-receiving layer including a light-heat converting agent and the hydrophilic layer not including a light-heat converting agent.

14. A heat-sensitive lithographic printing plate precursor comprising a support having provided thereon (A) an ink-receiving layer, (B) a hydrophilic layer comprising 80 to 99 parts by weight of a colloidal particulate oxide or hydroxide of at least one element selected from a group consisting of beryllium, magnesium, aluminum, silicon, titanium, boron, germanium, tin, zirconium, iron, vanadium, antimony and a transition metal, and 1 to 20 parts by weight of a polyacrylic acid having a weight-average molecular weight of more than 50,000, and (C) a water-soluble overcoat layer, and at least one of the ink-receiving layer and the water-soluble overcoat layer including a light-heat converting agent and the hydrophilic layer not including a light-heat converting agent.

* * * * *